United States Patent
Schimmel et al.

(10) Patent No.: US 10,095,119 B2
(45) Date of Patent: Oct. 9, 2018

(54) RADIATION SOURCE AND METHOD FOR LITHOGRAPHY

(71) Applicant: ASML Netherlands B.V., Veldhoven (NL)

(72) Inventors: Hendrikus Gijsbertus Schimmel, Utrecht (NL); Michel Riepen, Veldhoven (NL); Reinier Theodorus Martinus Jilisen, Eindhoven (NL); Dennis De Graaf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 125 days.

(21) Appl. No.: 14/442,415

(22) PCT Filed: Oct. 23, 2013

(86) PCT No.: PCT/EP2013/072124
§ 371 (c)(1),
(2) Date: May 13, 2015

(87) PCT Pub. No.: WO2014/075881
PCT Pub. Date: May 22, 2014

(65) Prior Publication Data
US 2016/0274467 A1 Sep. 22, 2016

Related U.S. Application Data

(60) Provisional application No. 61/726,843, filed on Nov. 15, 2012, provisional application No. 61/738,700, filed on Dec. 18, 2012.

(51) Int. Cl.
*G03B 27/54* (2006.01)
*G03F 7/20* (2006.01)
*H05G 2/00* (2006.01)

(52) U.S. Cl.
CPC ...... *G03F 7/70058* (2013.01); *G03F 7/70033* (2013.01); *G03F 7/70916* (2013.01);
(Continued)

(58) Field of Classification Search
CPC ........ H05G 2/008; H05G 2/005; H05G 2/006; G03F 7/70033; G03F 7/70058; G03F 7/70916
See application file for complete search history.

(56) References Cited

U.S. PATENT DOCUMENTS

| 5,459,771 A | 10/1995 | Richardson et al. |
| 5,577,092 A | 11/1996 | Kubiak et al. |

(Continued)

FOREIGN PATENT DOCUMENTS

| JP | 2003-528710 A | 9/2003 |
| JP | 2008-532293 A | 8/2008 |

(Continued)

OTHER PUBLICATIONS

International Search Report directed to related International Patent Application No. PCT/EP2013/072124, dated Apr. 24, 2014; 6 pages.

(Continued)

*Primary Examiner* — Deoram Persaud
(74) *Attorney, Agent, or Firm* — Sterne, Kessler, Goldstein & Fox P.L.L.C.

(57) ABSTRACT

A radiation source suitable for providing radiation to a lithographic apparatus generates radiation from a plasma (12) generated from a fuel (31) within an enclosure comprising a gas. The plasma generates primary fuel debris collected as a fuel layer on a debris-receiving surface ((33*a*), (33*b*)). The debris-receiving surface is heated to a temperature to maintain the fuel layer as a liquid, and to provide a reduced or zero rate of formation gas bubbles within the (Continued)

liquid fuel layer in order to reduce contamination of optical surfaces (14) by secondary debris arising from gas bubble eruption from the liquid fuel layer. Additionally or alternatively, the radiation source may have a debris receiving surface positioned and/or oriented such that substantially all lines normal to the debris receiving surface do not intersect an optically active surface of the radiation source.

26 Claims, 4 Drawing Sheets

(52) U.S. Cl.
CPC ............. *H05G 2/005* (2013.01); *H05G 2/006* (2013.01); *H05G 2/008* (2013.01)

(56) References Cited

U.S. PATENT DOCUMENTS

| | | | |
|---|---|---|---|
| 6,647,088 B1 | 11/2003 | Schmidt et al. | |
| 8,071,963 B2* | 12/2011 | Van Herpen | G03F 7/70858 250/492.2 |
| 8,586,954 B2* | 11/2013 | Asayama | H05G 2/003 250/365 |
| 8,680,493 B2* | 3/2014 | Schepers | G03F 7/70033 250/504 R |
| 8,895,946 B2* | 11/2014 | Ceglio | G21K 1/067 250/504 R |
| 2004/0141165 A1* | 7/2004 | Zukavishvili | B82Y 10/00 355/53 |
| 2004/0165171 A1 | 8/2004 | Tran et al. | |
| 2004/0183486 A1 | 9/2004 | Goldstein | |
| 2006/0219957 A1* | 10/2006 | Ershov | B82Y 10/00 250/504 R |
| 2006/0255298 A1 | 11/2006 | Bykanov et al. | |
| 2007/0115445 A1* | 5/2007 | Box | G03F 7/70858 355/30 |
| 2007/0125968 A1* | 6/2007 | Klunder | G03F 7/70008 250/504 R |
| 2008/0142736 A1* | 6/2008 | Wassink | G03F 7/70858 250/492.1 |
| 2008/0142741 A1* | 6/2008 | Van Herpen | B82Y 10/00 250/492.22 |
| 2009/0090877 A1* | 4/2009 | Van Empel | G03F 7/70175 250/504 R |
| 2009/0284725 A1* | 11/2009 | Soer | G02B 5/1838 355/67 |
| 2010/0085547 A1 | 4/2010 | Labetski et al. | |
| 2010/0183962 A1 | 7/2010 | Dorsel et al. | |
| 2010/0213395 A1 | 8/2010 | Ueno et al. | |
| 2011/0026002 A1* | 2/2011 | Loopstra | G03F 7/70033 355/71 |
| 2011/0164236 A1* | 7/2011 | Yakunin | G03F 7/70033 355/67 |
| 2011/0222040 A1* | 9/2011 | Steinhoff | G03F 7/70916 355/67 |
| 2011/0248191 A1* | 10/2011 | Fomenkov | H05G 2/005 250/504 R |
| 2011/0253913 A1 | 10/2011 | Nagai et al. | |
| 2013/0077070 A1* | 3/2013 | Schimmel | G03F 7/70916 355/67 |
| 2014/0319387 A1* | 10/2014 | Kim | H05G 2/006 250/504 R |
| 2014/0375974 A1* | 12/2014 | Yakunin | G03F 7/70033 355/67 |
| 2015/0029478 A1* | 1/2015 | Schimmel | G03F 7/70033 355/67 |
| 2015/0156855 A1* | 6/2015 | Ershov | H05G 2/006 250/504 R |
| 2015/0338753 A1* | 11/2015 | Riepen | G03F 7/70033 250/504 R |
| 2016/0209753 A1* | 7/2016 | Zhao | G03F 7/70033 |
| 2016/0252821 A1* | 9/2016 | De Jong | G03F 7/70033 355/71 |
| 2016/0330826 A1* | 11/2016 | Niimi | H05G 2/003 |
| 2016/0377985 A1* | 12/2016 | Nienhuys | G03F 7/70033 355/67 |
| 2017/0064799 A1* | 3/2017 | Yabu | G03F 7/70033 |

FOREIGN PATENT DOCUMENTS

JP 2010-093249 A 4/2010
WO WO2010/028899 A1 3/2010

OTHER PUBLICATIONS

International Preliminary Report on Patentability and Written Opinion of the International Searching Authority directed to related International Patent Application No. PCT/EP2013/072124, dated May 19, 2015; 10 pages.

* cited by examiner

RADIATION SOURCE AND METHOD FOR LITHOGRAPHY

CROSS-REFERENCE TO RELATED APPLICATIONS

This application claims the benefit of U.S. provisional application 61/726,843, which was filed on 15 Nov. 2012 and U.S. provisional application 61/738,700, which was filed 18 Dec. 2012, and which are incorporated herein in its entirety by reference.

FIELD

The present invention relates to a method and apparatus for generating radiation for use in lithographic applications for device manufacture.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include an excitation beam such as a laser (for instance and infra-red laser) for exciting a fuel to provide the plasma, and a radiation source for containing the plasma. The plasma may be created, for example, by directing a laser beam (i.e., initiating radiation) at a fuel, such as particles (usually droplets) of a suitable fuel material (e.g., tin), or a stream of a suitable gas or vapour, such as Xe gas or Li vapour. The resulting plasma emits output radiation, e.g., EUV radiation, which is collected using a radiation collector. The radiation collector may be a mirrored normal incidence radiation collector (sometimes referred to as a near normal incidence radiation collector), which receives the radiation and focuses the radiation into a beam. The radiation collector may have any other suitable form, such as a grazing incidence collector. The radiation source may include an enclosing structure or chamber arranged to provide a vacuum or low pressure environment to support the plasma. Such a radiation system is typically termed a laser produced plasma (LPP) source. In another system, which may also employ the use of a laser as an excitation beam, radiation may be generated by a plasma formed by the use of an electrical discharge—a discharge produced plasma (DPP) source. Discharge Produced Plasma (DPP) radiation sources generate radiation, such as extreme ultraviolet radiation (EUV) from a plasma formed by means of a discharge, and in particular may involve high temperature vaporisation of a metal fuel for the generation of radiation by directing an excitation beam such as a laser beam towards the metal fuel. Metal, typically in molten form, may be supplied to discharge surfaces of plasma-excitation electrodes and vaporized by means of irradiation with an excitation beam such as a laser beam whereby a high temperature plasma may be subsequently excited from the vaporized metal fuel by means of a high voltage discharge across the electrodes.

The DPP radiation source apparatus may include an enclosing structure or chamber arranged to provide a vacuum or low pressure environment to support the plasma. The resulting plasma emits output radiation, e.g., EUV radiation, which is collected using a radiation collector, such as a mirrored normal incidence radiation collector, which may form part of the radiation source apparatus. In such a case, the radiation source apparatus may be referred to as a source collector apparatus.

As used herein, the term vaporization is considered to also include gasification, and the fuel after vaporization may be in the form of a gas (for instance as individual atoms) and/or a vapour (comprising small droplets). The term "particles" is used herein includes both solid and liquid (i.e., droplet) particles.

Generation of plasma may result in contamination of the radiation source caused by particulate debris from the fuel. For example, where liquid tin is used as a fuel source, some of the liquid tin will be converted into a plasma, but particles of liquid tin may be emitted at high speeds from the plasma formation location. Such fuel particles are referred to herein as primary debris particles. The liquid fuel particles may solidify on other components within the radiation source, affecting the ability of the radiation source to generate a radiation producing plasma or to provide a beam of radiation from the plasma. In order to reduce or hinder contamination of optically-active surfaces within the radiation source, by the primary debris, debris-receiving surfaces may be positioned within the radiation source to deflect or capture such primary debris particles. In this specification, the term "optically-active" is merely used to denote surfaces which have an optical role to play, such as mirrors, lenses, viewing ports, sensors and the like, and is not meant to imply any optical activity in terms of the modification of the optical axis of polarised radiation (which is understood to be an alternative meaning of the term "optical activity" in the art).

SUMMARY

It has been found that in radiation sources employing liquid fuel for the radiation-generating plasma, ejection of fuel particles from liquid fuel layers situated on surfaces within the EUV radiation source may act as a secondary source of fuel debris. This phenomenon is referred to herein as spitting, and has generally been observed to result in particles being ejected from liquid fuel layers in a direction substantially normal to the outer surface of the liquid fuel layer during use of a radiation source.

It is desirable to obviate or mitigate at least one problem of the prior art, whether identified herein or elsewhere, or to provide an alternative to existing apparatus or methods for radiation sources. In particular it is one object of the invention, amongst others, to reduce or prevent the contamination of optically-active surfaces by fuel particles which may arise as secondary debris by spitting from liquid fuel layers. The term "layer" as used herein in this context term includes any portions of liquid fuel which are sufficient in volume and/or surface area to generate spitting.

Without wishing to be bound by any scientific theory, it has now been realized that the spitting effect arises as a result of nucleation of gas bubbles within the liquid fuel layer, where the gas bubbles arise from gas free-radicals reacting with the fuel, and the reaction product subsequently decomposing to form gas bubbles, within the liquid fuel layer. The gas diffusion out of the liquid at low temperatures is too slow to prevent nucleation of gas bubbles within the liquid fuel. It is thought that the eruption of such gas bubbles from the liquid fuel layer leads to the spitting phenomenon. Such gas free-radicals are formed when a radical-forming gas such as hydrogen is present within the enclosure of the radiation source, the free-radicals arising from interaction between the gas and the plasma and/or radiation, such as EUV radiation, generated by the plasma.

Surprisingly, it has been realized that the mechanism giving rise to the spitting can be suppressed by increasing the temperature of the liquid fuel layer, such that it is possible to reduce or even totally prevent the spitting from liquid fuel layers by sufficiently increasing the fuel layer temperature above the melting point of the liquid fuel.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components.

Whenever appropriate, the use of the term "comprises" or "comprising" may also be taken to include the meaning "consists essentially of" or "consisting essentially of", or may include the meaning "consists of" or "consisting of".

Optional and/or preferred features as set out herein may be used either individually or in combination with each other where appropriate and particularly in the combinations as set out in the accompanying claims. The optional and/or preferred features for each aspect of the invention set out herein are also applicable to any other aspects of the invention, where appropriate.

A first aspect of the invention provides a radiation source arranged to generate radiation from a plasma generated from a fuel within an enclosure comprising a gas, and the generated plasma resulting in emission of primary debris, the radiation source comprising:

a component having an optically-active surface, and a debris-receiving surface positioned and/or oriented such that, in use, the emission of primary debris causes contamination of the debris-receiving surface with a fuel layer, wherein the debris-receiving surface is arranged to be maintained at a temperature sufficiently high to maintain the fuel layer as a liquid and to provide a rate of formation of bubbles of the gas within the liquid fuel layer in use which is substantially lower than the rate of formation of bubbles of the gas within the liquid fuel layer at a temperature 20° C. in excess of the melting point of the fuel. The radiation source according to the first and any further aspect of the invention described herein may be suitable for providing radiation to a processing tool such as a lithographic apparatus.

The contamination of the debris-receiving surface may arise directly from the emission of primary debris. That is, the primary debris may be incident upon the debris-receiving surface directly, without first being incident upon another surface within the radiation source. The contamination of the debris-receiving surface may additionally or alternatively occur as an indirect result of the emission of primary debris. For example, the contamination of the debris-receiving surface may occur as a result of debris scattering, or dripping, onto the debris-receiving surface from another surface within the radiation source.

The debris-receiving surface may comprise a part of a larger surface.

Typically, debris-receiving surfaces for lithography radiation sources may be maintained at a temperature in excess of the melting point of the fuel, but to avoid unnecessary heating, the temperature may be above the melting point of the fuel by say 20° C. or 50° C. or less. This avoids unnecessary heating of debris-receiving surfaces whilst maintaining the temperature sufficient to maintain the fuel in a liquid or molten state whereby the collected primary fuel debris may be run-off the debris-receiving surfaces for consolidation and optional recycling. It had also been assumed that the spitting effect arose from some boiling or nucleation mechanism and so it was assumed that increasing the temperature would lead to an increase in secondary debris particles from the spitting phenomenon as a result of a conventional increase in chemical kinetics as temperature increases.

Higher temperatures have generally also been avoided in order to reduce risk of high vapour pressure of fuel within the enclosure of the radiation source, which was thought to potentially give risk of deposition of fuel onto cooler, optically-active surfaces as a result of deposition from the vapour phase.

Hence a typical temperature, prior to the realization of the present invention, would have been say 20° C. in excess of the fuel melting point, such as say about 250° C. for tin fuel.

Over a range of about 50° C. in excess of the melting point of the fuel, it has been found that increasing the temperature above the melting point for the fuel, within such a 50° C. range, has only a minor effect to reduce spitting. However, at more elevated temperatures, the rate of spitting reduction increases markedly. For instance for tin fuel in an enclosure maintained at 100 Pa hydrogen gas pressure, with a melting point of 232° C. for the tin, the number of secondary debris particles generated per minute for a fixed surface area at 350° C. is less than 90% of the number generated by the same surface area at 252° C. (i.e., a temperature 20° C. higher than the melting point). Such a reduction, of 10% or more, is considered herein as a substantial reduction. By a temperature of 550° C., for this arrangement of fuel and gas, the spitting effect has reduced to zero (100% reduction). In general, the application of a temperature of about 100° C. in excess of the melting point of the fuel, preferably at least 150° C. in excess of the melting point of the fuel, more preferably at least 200° C. in excess of the melting point of the fuel can be considered to provide a substantial reduction of the spitting effect.

In order to maintain the debris-receiving surface at an elevated temperature, the debris-receiving surface may comprises a heater, such as an electrical heater, or a heating pipe heated by a heat transfer fluid.

For instance, the radiation source according to the first aspect of the invention may have the debris-receiving surface arranged to be maintained at a temperature in excess of 300° C. in use, such as in excess of 350° C., for instance in excess of 400° C., say in excess of 500° C. or in excess of 550° C. Preferably, the debris-receiving surface is arranged to be maintained at a temperature less than the fuel boiling point in the presence of the gas, such as less than 1000° C., both to avoid high vapour pressures of fuel in the radiation source enclosure, and to prevent thermally driven corrosion of debris-receiving surfaces.

To further prevent corrosion at the high temperatures used in the invention, the debris-receiving surfaces may be of a steel alloy comprising molybdenum or may be of an alloy consisting essentially of molybdenum.

The debris-receiving surface is preferably arranged to be maintained at a temperature sufficiently high to prevent formation of bubbles of the gas within the liquid fuel layer in use. For instance the debris-receiving surface may be arranged to be maintained at a temperature of 550° C. or more in use. Such an arrangement would be effective for preventing spitting for tin fuel layers in a hydrogen gas at a pressure of 50 Pa or more, such as up to 500 Pa, for instance from 100 to 150 Pa.

The radiation source may for instance be a DPP radiation source, or may be an LPP radiation source, or may comprise combinations of elements typical of either type of source. For instance the radiation source may comprise a fuel droplet generator typical of an LPP source in combination with a grazing incidence collector and/or a foil trap for primary debris collection, the latter being typical of a DPP source. The radiation source may be arranged to receive an excitation beam such that, in use, the excitation beam is incident on the fuel at a plasma formation location to generate the plasma, and the debris-receiving surface and optically-active component may be mutually positioned and/or oriented such that substantially all lines normal to the debris-receiving surface do not intersect the optically-active surface of the component.

In this way, debris ejected, by spitting, along normal lines from the debris-receiving surface (i.e., substantially perpendicular to the debris-receiving surface) is not incident upon the optically-active surface of the component. Hence, debris that is referred to herein as secondary debris is not incident on the optically-active surface of the component.

The radiation source may comprise a shroud for shielding the fuel whilst the fuel travels to the plasma formation location and the debris-receiving surface comprises at least a part of a surface of the shroud.

The radiation source may comprise, as a component having an optically-active surface, a radiation collector arranged to collect radiation emitted by the plasma at the plasma formation location and to form a beam of radiation therefrom.

The radiation source according to any preceding claim may comprise a contaminant trap arranged to reduce propagation of debris generated by the plasma (i.e., primary debris) and the debris-receiving surface may comprises at least a part of a surface of the contaminant trap.

The component having an optically-active surface may comprise a sensor. For example, the component may comprise a sensor for detecting and/or analysing a characteristic parameter of the excitation beam or the radiation. For example, the sensor may be for detecting an alignment between the excitation beam and a fuel at the plasma formation location.

The component having an optically-active surface may comprise a viewport and the optically-active surface of the component may comprise a window of the viewport. For example, the viewport may comprise a window into a part of the radiation source, to assist diagnosis of problems with the radiation source.

The radiation source may comprise a contaminant trap arranged to reduce propagation of debris generated by the plasma. The debris-receiving surface may comprises at least a part of a surface of the contaminant trap.

The contaminant trap may comprise a plurality of vanes and the at least a part of the debris-receiving surface may comprise at least part of one of the plurality of vanes. The contaminant trap may comprise, for example, a rotating foil trap or a static trap.

The radiation source may further comprise a nozzle configured to direct a stream of fuel droplets along a trajectory towards the plasma formation location. The debris-receiving surface may comprises at least a part of a surface of the nozzle.

In one particularly suitable arrangement according to the invention, the radiation source may comprise first and second debris-receiving surfaces, positioned and/or oriented such that, in use, the emission of primary debris causes contamination of the debris-receiving surfaces with respective fuel layers, the first debris-receiving surface being the debris-receiving surface of the first aspect of the invention, wherein:

the second debris-receiving surface is arranged to be maintained at a temperature sufficiently high to maintain its respective fuel layer as liquid, and the second debris-receiving surface and component comprising an optically-active surface are mutually positioned and/or oriented such that substantially all lines normal to the second debris-receiving surface do not intersect the optically-active surface of the component.

In such an arrangement, for instance, if the second debris-receiving surface is a surface which may be difficult, or inconvenient, to heat or difficult, or inconvenient, to maintain at an elevated temperature in use, such as a rotating trap, then the reduction of contamination of optically-active surfaces by secondary debris may be achieved by this arrangement, without having to heat the second debris-receiving surface to the temperature required to reduce or eliminate spitting.

In another suitable arrangement of the first aspect of the invention, the radiation source suitable for providing radiation to a lithographic apparatus, may be a radiation source being arranged to receive an excitation beam such that, in use, the excitation beam is incident on a fuel at a plasma formation location resulting in emission of primary debris, the radiation source comprising:

a debris receiving surface positioned and/or oriented such that, in use, the emission of primary debris causes contamination of the debris receiving surface; and a component having an optically active surface;

wherein the debris receiving surface and component are positioned and/or oriented such that substantially all lines normal to the debris receiving surface do not intersect the optically active surface of the component.

In other words, for this arrangement, the debris-receiving surface is not necessarily arranged to be maintained at a temperature sufficiently high to provide a rate of formation of bubbles of the gas within the liquid fuel layer in use which is substantially lower than the rate of formation of bubbles of the gas within the liquid fuel layer at a temperature 20° C. in excess of the melting point of the fuel. Instead, the positioning or orientation of the debris receiving surface and component having an optically active surface are positioned and/or oriented such that substantially all lines normal to the debris receiving surface do not intersect the optically active surface of the component.

For this arrangement, the radiation source comprises a shroud for shielding the fuel while the fuel travels to the plasma formation location; and the debris receiving surface may comprises at least a part of a surface of the shroud.

The component having an optically active surface may comprises a radiation collector arranged to collect radiation emitted by a plasma at the plasma formation location and form a beam of radiation therefrom. The component may comprise a sensor. The component may comprise a viewport and the optically active surface of the component may comprise a window of the viewport.

The radiation source may comprise a contaminant trap arranged to reduce propagation of debris generated by a plasma; and the debris receiving surface may comprise at least a part of a surface of the contaminant trap. The contaminant trap may comprise a plurality of vanes and the debris receiving surface may comprise at least part of one of the plurality of vanes.

For this arrangement, the radiation source may further comprise a gas barrier, in particular the gas barrier may comprise a hydrogen gas barrier.

The radiation source of this arrangement may further comprise a nozzle configured to direct a stream of fuel droplets along a trajectory towards a plasma formation location with the debris receiving surface comprising at least a part of a surface of the nozzle.

A second aspect of the invention provides a method of generating radiation for example for a lithography apparatus, the method comprising generating a plasma from a fuel in an enclosure of a radiation source according to the first aspect of the invention, the enclosure comprising a gas, wherein the radiation is emitted from the plasma, wherein, in use, the debris-receiving surface is maintained at a temperature sufficiently high to maintain the fuel layer as a liquid and to provide a rate of formation of bubbles of the gas within the liquid fuel layer in use which is substantially lower than the rate of formation of bubbles of the gas within the liquid fuel layer at a temperature 20° C. in excess of the melting point of the fuel.

The optional and preferred features as set out for the first aspect of the invention are also applicable to this second aspect of the invention.

The gas preferably comprises or consists essentially of hydrogen. The gas may typically be present at a partial pressure from 50 to 500 Pa, such as from 80 to 200 Pa, for instance from 100 to 150 Pa. It is usual for hydrogen gas to be present within the enclosure of a radiation source for generation of radiation for lithography, such as an LPP source, whereby the radiation-generating plasma interacts with the gas to form hydrogen free-radicals, which are useful for maintaining clean, optically-active surfaces for optical components within the radiation source. Furthermore, gas such as hydrogen gas, may be used to provide a gas flow or gas barrier or gas curtain used to divert primary debris away from optically-active surfaces of the radiation source. Such a gas flow or gas barrier/curtain leads to presence of the gas within the enclosure of the radiation source. Suitably, the gas pressure is maintained at 500 Pa or less such as 200 Pa or less, or 150 Pa or less, in order to avoid excessive absorption of generated radiation, such as EUV radiation, by the gas when the radiation source is in use.

For the method of the second aspect of the invention, the debris-receiving surface may be maintained at a temperature of 300° C. or more in use, such as in excess of 350° C., for instance in excess of 400° C., say in excess of 550° C. or in excess of 700° C. In general, the application of a temperature of about 100° C. in excess of the melting point of the fuel, preferably at least 150° C. in excess of the melting point of the fuel, more preferably at least 200° C. in excess of the melting point of the fuel can be considered to provide a substantial reduction of the spitting effect.

The debris-receiving surface may be maintained at a temperature sufficiently high to prevent formation of bubbles of the gas within the liquid fuel layer in use. For instance, the debris-receiving surface may be maintained at a temperature of 550° C. or more in use, such as 700° C. or more. Such a method would, for instance, be effective for preventing spitting for tin fuel layers in a hydrogen gas at a pressure of 50 Pa or more, such as up to 500 Pa, for instance from 100 to 150 Pa. With respect to the avoidance or mitigation of the spitting effect as described, it is further worth mentioning that the generation of bubbles in a liquid fuel layer may also be mitigated by ensuring that the surface that is covered by the liquid fuel layer is sufficiently smooth. As such, in an embodiment of the present invention, the debris-receiving surfaces as applied have received a polishing or micro polishing treatment.

Yet another way of mitigating the spitting effect is to provide a carbon layer on top of the liquid fuel layer. The application of such a carbon layer has been found to prevent, to a large extend, the spitting effect.

Preferably, the radiation generated from the plasma comprises EUV radiation, more preferably consisting essentially of EUV radiation (such as 95% of the radiation power). The fuel is suitably a metal fuel such as tin, which is highly effective for generation of EUV radiation when excited into a plasma state.

A third aspect of the invention provides an apparatus arranged to project a conditioned radiation beam (such as a radiation beam patterned by a patterning device) onto a substrate, wherein the lithographic apparatus comprises a radiation source according to the first aspect of the invention.

The apparatus of the third aspect of the invention may further comprise:

an illumination system configured to condition the radiation generated by the radiation source to form a conditioned radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

The apparatus may comprise a further debris-receiving surface, for instance within the illumination system, positioned and/or oriented such that, in use, the emission of primary debris causes contamination of the debris-receiving surface with a fuel layer, wherein the debris-receiving surface is arranged to be maintained at a temperature sufficiently high to maintain said fuel layer as a liquid and to provide a rate of formation of bubbles of said gas within said liquid fuel layer in use which is substantially lower than the rate of formation of bubbles of said gas within said liquid fuel layer at a temperature 20° C. in excess of the melting point of said fuel.

A fourth aspect of the invention provides a device manufacturing method comprising generating radiation using the apparatus of the third aspect of the invention.

The method of the fourth aspect of the invention may further comprise:

generating a beam of EUV radiation using the radiation source;

conditioning the radiation beam in the illumination system and directing the radiation beam onto a patterning device supported by the support structure; and projecting, by means of the projection system, a patterned radiation beam onto a substrate held by the substrate table.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
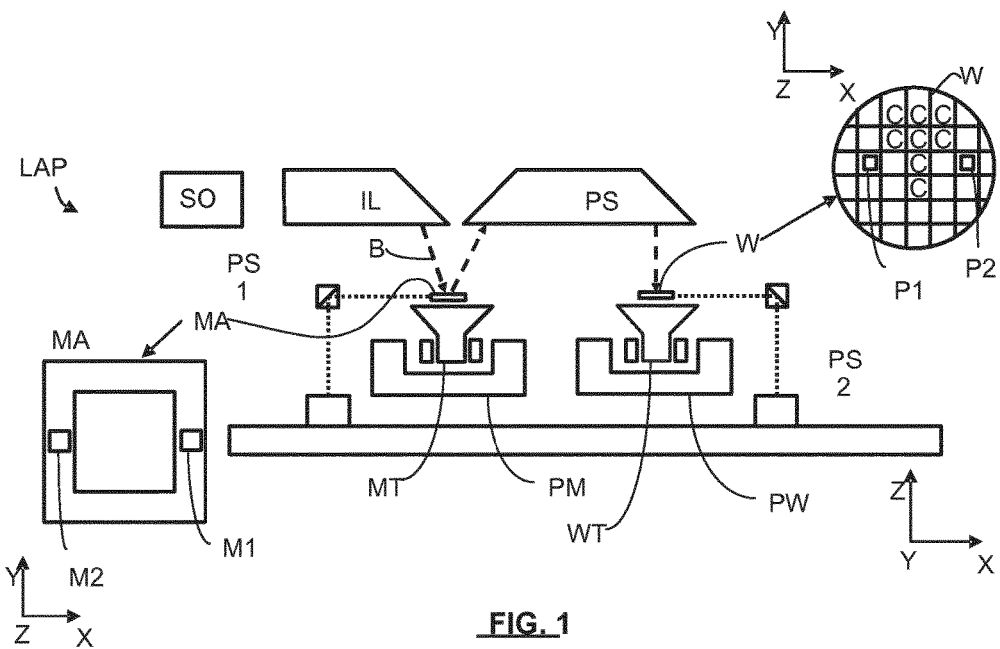
FIG. 1 schematically depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LAP including radiation source SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum or at least a low gas pressure environment for EUV radiation since gases may absorb too much radiation. A vacuum or low gas pressure environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation (EUV) beam from the radiation source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream, cluster or jet of material having the required EUV line-emitting element, with a laser beam such as an infra-red laser beam. The radiation source SO may be part of an EUV radiation system including a fuel stream generator for generating a stream of fuel and/or a laser (neither of which are shown in FIG. 1), for providing the laser beam for exciting the fuel. The resulting plasma emits output radiation, e.g., EUV radiation, which is collected using a radiation collector, disposed within an enclosure of the radiation source. The laser and/or fuel stream generator and the collector module, may be separate entities from the radiation source, or the radiation source may comprise these integers.

For example, when a $CO_2$ IR-laser is used to provide the laser beam for fuel excitation, this may be considered as separate from the rest of the radiation source, with the radiation source arranged to accept a laser beam from the IR-laser.

In such cases, the laser is not considered to form part of the lithographic apparatus and the radiation beam is passed from the laser to the radiation source with the aid of a beam delivery system comprising, for example, suitable directing mirrors and/or a beam expander. In other cases the excitation beam source may be an integral part of the radiation source, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Figure 2:
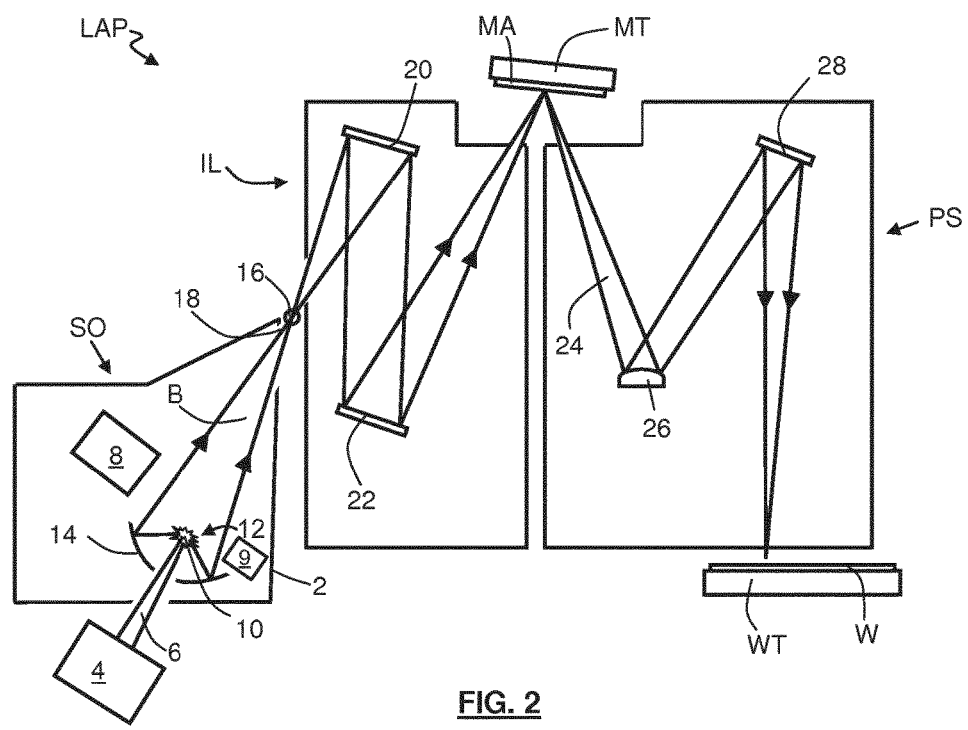
FIG. 2 is a more detailed view of the apparatus of FIG. 1, including an LLP radiation source according to an embodiment of the invention.

FIG. 2 shows the lithographic apparatus LAP in more detail, including the radiation source SO, the illumination system IL, and the projection system PS. The radiation source SO is constructed and arranged such that a vacuum or low gas pressure environment can be maintained in an enclosing structure 2 of the radiation source.

A laser 4 is arranged to deposit laser energy via a laser beam 6 into a fuel, such as tin (Sn) or lithium (Li) which is provided from a fuel stream generator 8. Liquid (i.e., molten) tin, or another metal in liquid form, is preferred. A fuel trap 9 is arranged to receive fuel not spent during plasma creation. The deposition of laser energy into the fuel creates a highly ionized plasma 10 at a plasma formation location 12 which has electron temperatures of several tens of electron volts (eV). The energetic radiation generated during de-excitation and recombination of these ions is emitted from the plasma 10, collected and focused by a near normal incidence radiation collector 14 (sometimes referred to more generally as a normal incidence radiation collector). The collector 14 may have a multilayer structure, for example one tuned to reflect, more readily reflect, or preferentially reflect, radiation of a specific wavelength (e.g., radiation of a specific EUV wavelength). The collector 14 may have an elliptical configuration, having two natural ellipse focus points. One focus point will be at the plasma formation location 10, and the other focus point will be at the intermediate focus, discussed below.

A laser 4 and/or radiation source and/or a collector 14 may together be considered to comprise a radiation source, specifically an EUV radiation source. The EUV radiation source may be referred to as a laser produced plasma (LPP) radiation source. The collector 14 in the enclosing structure 2 may form a collector module, which forms a part of the radiation source (in this example).

A second laser (not shown) may be provided, the second laser being configured to preheat the fuel before the laser beam 6 is incident upon it. An LPP source which uses this approach may be referred to as a dual laser pulsing (DLP) source. Such a second laser may be described as providing a pre-pulse into a fuel target, for example to change a property of that target in order to provide a modified target. The change in property may be, for example, a change in temperature, size, shape or the like, and will generally be caused by heating of the target.

Although not shown, the fuel stream generator 8 will generally comprise, or be in connection with, a nozzle configured to direct fuel, along a trajectory towards the plasma formation location 12.

Radiation B that is reflected by the radiation collector 14 is focused at a source image 16. The source image 16 is commonly referred to as the intermediate focus, and the radiation source SO is arranged such that the intermediate focus 16 is located at or near to an opening 18 in the enclosing structure 2. The source image 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures. For example there may be 1-6 (or more) additional reflective elements present in the projection system PS than shown in FIG. 2.

As described above, fuel is provided in the form of a liquid fuel, such as liquid tin. Problems may arise, however, from the use of liquid fuels. In particular, while a portion of the liquid fuel will be converted into a plasma, a significant amount of the liquid fuel may be ejected as particulate debris. Ejection of liquid fuel may occur as a result of the conversion into plasma, itself, and, where droplet fuel targets are used, through interaction of subsequent fuel droplets with previously-generated plasma. Such primary particulate debris may be ejected at high speeds, and can lead to a number of problems within the radiation source SO. For example, the impact of high speed particulate debris may corrode other components of the radiation source SO, such as the nozzle from which the liquid fuel is ejected, and the optically-active surfaces of the collector 14. Fuel debris may also deposit on such surfaces. In addition to problems within the radiation source SO, it is further desirable to prevent such debris travelling into the rest of the lithographic apparatus where it might damage other sensitive components.

Figure 3:
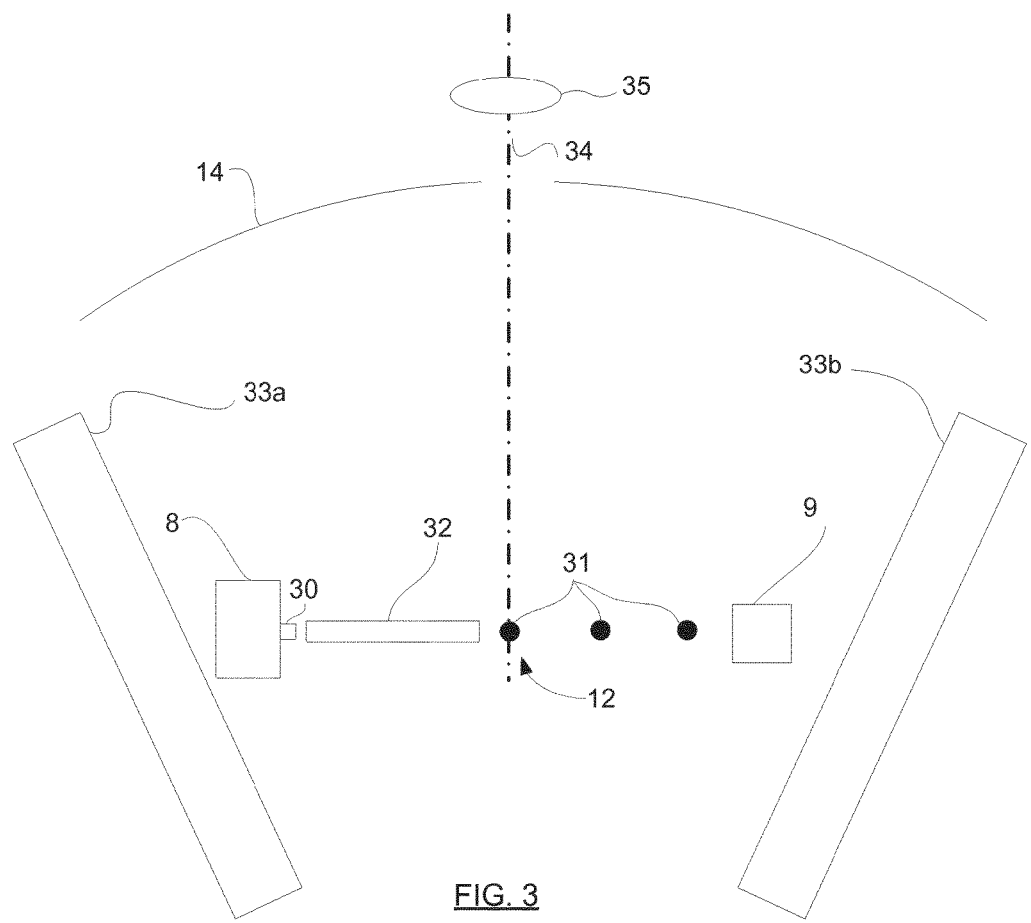
FIG. 3 schematically depicts part of a radiation source according to an embodiment of the present invention.

FIG. 3 illustrates parts of the radiation source SO in an embodiment of the invention. Features of FIG. 3 common to FIGS. 1 and 2 have been given the same reference numbers for ease of understanding. In the embodiment illustrated in FIG. 3, a contaminant trap is provided to give one or more debris-receiving surfaces. The contaminant trap, in some embodiments, takes the form of a plurality vanes around the outside of the housing of the radiation source SO. Two vanes 33a, 33b are visible in FIG. 3. The vanes 33a, 33b are arranged to capture and to direct primary debris emitted by the plasma to one or more debris collection traps (not shown). The vanes 33a, 33b are, in some embodiments of the invention, combined with other debris mitigation devices, for example a gas barrier. A gas barrier comprises a low background pressure of a suitable gas, e.g., argon, hydrogen or helium, and/or a stream of gas across the path of the radiation. A gas bather in an embodiment of the invention may only be used only to provide mechanical suppression of debris, but is preferably a gas which generates free-radicals such as hydrogen free radicals for use in chemical scavenging of surfaces within the radiation source.

Whilst not shown in FIG. 3, in some embodiments, the contaminant trap may comprise one or more rotating foil traps. A rotating foil trap comprises a plurality of spaced-apart foils, driven to rotate around an axle aligned with the optical axis 34 of the radiation source SO. The speed of rotation of the rotating foil trap is determined so that primary debris particles emitted from the plasma are swept up by the foils; there is insufficient time for a debris particle to pass between the foils before that gap is swept by the rotating foils. Electromagnetic radiation is substantially unaffected by the rotating foil trap as the trap presents a very small area viewed from the radiation source point at the plasma formation location.

The contaminant trap is, in some embodiments of the invention, combined with other debris mitigation devices, for example a gas barrier. A gas barrier comprises a low background pressure of a suitable gas, e.g., argon, hydrogen or helium, and/or a stream of gas across the path of the radiation. A gas barrier in an embodiment of the invention is used only to provide mechanical suppression of debris. Therefore, a wide choice of suitable gasses is available. In some embodiments, a rotating foil trap can be combined, or replaced, with a stationary foil trap.

In FIG. 3, there is also shown a nozzle 30 connected to the fuel stream generator 8 to direct droplets of fuel 31 to the plasma formation location 12 and, subsequently, the fuel trap 9. Additionally in the embodiment of FIG. 3, a shroud 32 is positioned between the fuel stream generator 8 and the plasma formation location 12, such that the fuel droplets 31 exiting the nozzle 30, travel through the shroud 32, exiting the shroud 32 a short distance before the plasma formation location 12. The shroud 32 acts to protect the fuel droplets 31 from interference. For example, the shroud 32 acts to protect the fuel droplets 31 from interactions with primary debris generated during plasma formation. An optical element 35 is positioned before (with respect to the direction of propagation of the laser beam 6) the collector 14, to focus the laser beam 6 at the plasma formation location 12. In FIG. 3, the optical element 35 is shown as a lens, although it will be appreciated that the optical element 35 may be any optical element suitable for focusing the laser beam 6 toward the plasma formation location 12.

In some embodiments of the invention, the radiation source SO comprises one or more sensors (not shown) to determine a relative alignment between a focus of the laser beam 6 and the fuel droplet. The ability to have some indication of the relative alignment between the fuel and the focus of the laser beam 6 directed at the fuel may be beneficial due to the fact that it may be desirable to control the radiation source SO such that the radiation output from the radiation source has a desired distribution. Alternatively, or in addition, it may be desirable to have an indication of the relative alignment between the fuel and the focus of the laser beam 6 directed at the fuel due to the fact that both the position of the fuel and the position of the focus of the radiation directed at the fuel may be subject to external disturbances. For example, the focus position of the radiation directed at the fuel and the position of the fuel (and hence the alignment between the fuel and the focus of the radiation directed at the fuel) may be affected by system dynamics of the lithographic apparatus, such as the movement of parts of the lithographic apparatus. The ability to have an indication of the relative alignment between the fuel and the focus of the radiation directed at the fuel means that any misalignment between the fuel and the focus of the radiation directed at the fuel may be able to be corrected. Additional sensors may be provided within the lithographic apparatus for a plurality of purposes.

To aid maintenance of the radiation source SO, the radiation source SO may be provided with one or more viewports (not shown) to allow a user of the radiation source SO/lithography apparatus to more easily view and diagnose problems with the apparatus.

Liquid tin debris may solidify upon the surfaces upon which it is incident, thereby creating additional problems within the radiation source SO. For example, it will be appreciated that tin contamination of the collector 14 may reduce the efficiency with which the collector 14 can collect and focus radiation produced by the plasma. Similarly, contamination of the optical element 35 may affect the ability of the optical element 35 to focus the laser beam 6 at the plasma formation location 12. Additionally, cooling of liquid metal fuels such as tin has been shown to form stalagmite and stalactite-like structures on surfaces within the radiation source module. Such structures may impede the emission of EUV radiation from the radiation source SO, or interfere with the provision of liquid fuel to the plasma formation location 12. Further, solidification of tin on the vanes 33a, 33b reduces the effectiveness with which the vanes 33a, 33b are able to remove debris from the radiation source SO. In general, therefore, contamination of sensitive surfaces of the radiation source SO and lithography apparatus, by liquid tin (or another liquid fuel source), may reduce the amount of EUV radiation provided to other components of the lithography apparatus.

With reference to FIG. 3, and the details set out above, components with optically-active surfaces may include, for example, the collector 14, the optical element 35, sensors within the radiation source SO and lithography apparatus, and viewports. It will be appreciated that the present invention is not limited in applicability to the components provided as examples above. Indeed, in the context of the present discussion, components with optically-active surfaces may include any surfaces of the radiation source SO and lithography apparatus for which interaction with tin debris may result, either directly or indirectly, in a reduction of an amount of EUV radiation provided to a target (i.e., a wafer). For example, indirect reductions may result from an inability to properly maintain the radiation source SO or lithography apparatus as a result of viewports becoming unusable due to fuel debris deposition or corrosion.

In order to prevent liquid fuel debris from solidifying on the surfaces on which the debris is incident (either directly, or indirectly), some surfaces within the radiation source SO may be maintained at a temperature above the melting point of the fuel material. For example, where liquid tin is the fuel material, selected surfaces within the radiation source SO may be kept at a temperature of or above 232° C. to prevent the incident debris from solidifying. In particular, with reference to FIG. 3, the surfaces of the shroud 32, and the vanes 33a, 33b may be kept at a temperature of or above 232° C. In this way, rather than solidifying on the surfaces of the shroud 32 and the vanes 33a, 33b, it is intended that liquid tin debris will run off those surfaces into one or more debris collectors (not shown). Furthermore, in accordance with the invention, one or more of such debris-receiving surfaces may be arranged to be maintained at a temperature sufficiently high to maintain the fuel layer as a liquid and to provide a rate of formation of bubbles of gas within the liquid fuel layer in use which is substantially lower than the rate of formation of bubbles of gas within the liquid fuel layer at a temperature 20° C. in excess of the melting point of the fuel.

As discussed above, in addition to the contaminant trap provided by the vanes 33a, 33b, gas barriers may be employed to prevent debris from travelling into other parts of the lithographic apparatus. In some embodiments of the present invention, hydrogen is used to provide a gas barrier. It has been realised that in the presence of gas barriers, such as hydrogen gas barriers, bubbles may form within surfaces of liquid tin within the radiation source SO. The increased pressure caused by the bubbles in the surfaces of liquid tin result in the ejection of particulate debris from those surfaces, in a phenomenon referred to as spitting. The ejection is generally substantially perpendicular to the surface of the tin. Such spitting has been observed to take place within both relatively thin layers of tin (e.g., with a thickness of around 10 µm) and within deeper layers of liquid tin (e.g., with a thickness of around 3 mm depths). The particles of tin produced by the above described effect may have diameters of 100 µm (but may be smaller or larger) and have speeds of around 3 m/s (but may be faster or slower). In accordance with an embodiment of the invention, the spitting phenomenon may be reduced or even eliminated by the expedient heating of the debris-receiving surfaces to a sufficient temperature in use, as set out hereinabove.

Ejection of tin debris directly from the plasma may be thought of as primary debris, while ejection of tin debris by spitting from debris-receiving surfaces contaminated by fuel layers, formed as a result of the primary debris (primary contamination), may be thought of as secondary debris. It will be appreciated that further orders of debris and contamination are possible. For example, surfaces contaminated by the secondary debris (secondary contamination) may give rise to tertiary debris, etc. Additionally, debris incident on a first surface may drip or scatter onto a second surface leading to bubbles forming in, and debris being ejected from, the tin now coating the second surface. The ejection of particles from tin-coated surfaces of the radiation source SO, therefore provides a further mechanism by which sensitive components of the radiation source SO can become coated in, and damaged by, tin debris, resulting in disadvantages to EUV radiation generation as discussed hereinbefore.

Figure 4:
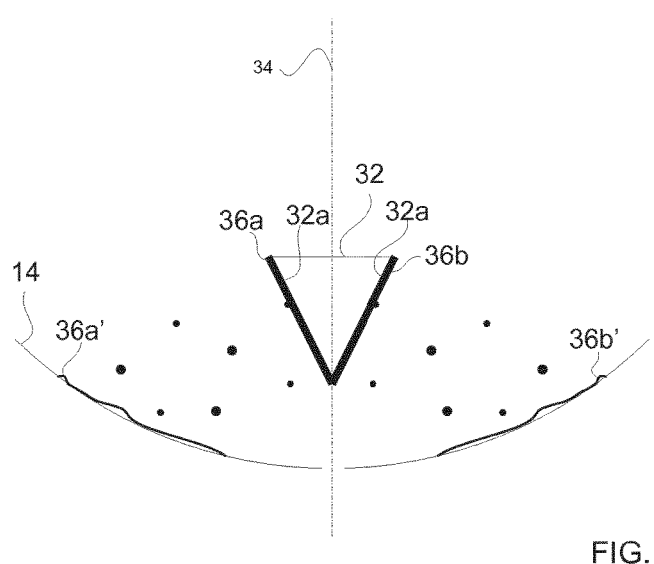
FIG. 4 schematically depicts a part of the radiation source of FIG. 3.

FIG. 4 schematically illustrates a part of the arrangement of FIG. 3 viewed in a direction perpendicular to the optical axis 34, through the shroud 32. In FIG. 4, surfaces 32a, 32b of the shroud 32 has been coated with layers 36a, 36b of liquid tin as a result of primary debris from the plasma (not shown). As discussed above, to avoid solidification of the primary debris on the shroud 32, the shroud 32 is maintained at a temperature above the melting point of tin. As such, the layers of tin 36a, 36b remain liquid, and gas bubbles may therefore formed within the layers of tin 36a, 36b. Such bubbles formed within the liquid tin would result in subsequent ejection of secondary debris in a direction substantially perpendicular to the surfaces 32a, 32b. As such, it can be seen in FIG. 4, that the secondary debris would be ejected towards the collector 14, resulting in secondary contamination 36a', 36b' of the collector 14. In accordance with the invention, this secondary debris arising from spitting may be reduced or eliminated by sufficient heating of the shroud 32, for instance with a heater (not shown).

Figure 5:
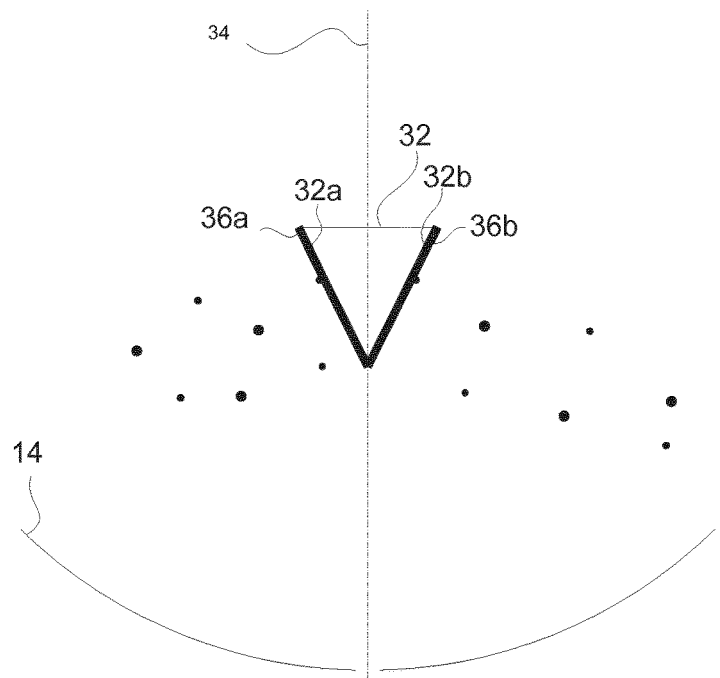
FIG. 5 schematically depicts the part of the radiation source of FIG. 4 according to an alternative embodiment.

FIG. 5 illustrates an alternative embodiment of the present invention, which is a modification of the embodiment illustrated in FIG. 3. In the embodiment shown in FIG. 5, the shroud 32 has been positioned within the radiation source SO such that normal lines from the surfaces 32a, 32b do not intersect the surface of the collector 14. As such, secondary debris ejected in a direction perpendicular to the surfaces 32a, 32b (i.e., along paths defined by normal lines from the surfaces 32a, 32b), is not incident upon the collector 14. In this way, the collector 14 is maintained free from contamination by secondary debris. In other embodiments of the invention, in addition, or alternatively, to altering the position of the shroud 32, the shape of the shroud 32 may be altered to remove or minimize any intersection between normal lines extending from the surfaces of the shroud 32 and the collector 14. For example, while the shroud 32 is shown as a hollow triangular prism in FIGS. 4 and 5, the shroud 32 may take any appropriate shape. This may be combined with heating the shroud 32 to a temperature sufficient to lead to a substantial reduction in secondary debris arising from spitting.

Figure 6:
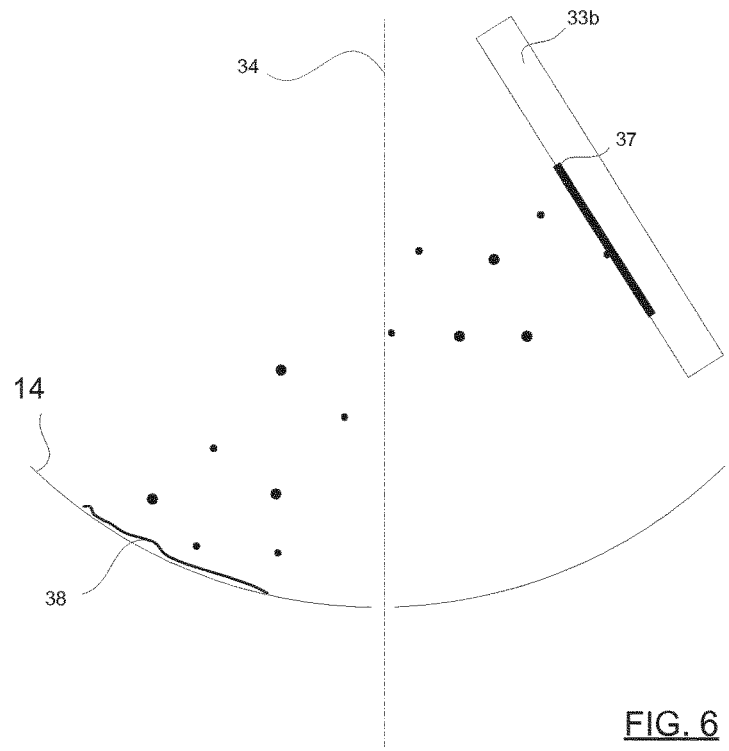
FIG. 6 schematically depicts a part of the radiation source of FIG. 3 in more detail.

A further embodiment is discussed with reference to FIGS. 6 and 7. FIG. 6 schematically illustrates a part of the embodiment of FIG. 3 (from the same perspective as FIG. 3) in further detail. In particular, the reflector 14 and the vane 33b are illustrated. A portion of the vane 33b has been coated in a layer 37 of liquid tin as a result of primary debris. Normal lines extending from the surface of the vane 33b coated in the layer 37 intersect the collector 14, such that secondary debris emitted by the layer 37 are incident on the collector 14, coating the collector 14 in a layer 38 of tin. Hence, in accordance with the invention, for the arrangement shown in FIG. 6, the secondary debris arising from tin spitting may be reduced (say at 350° C.) or eliminated (say at 550° C.) by sufficient heating of the vane 33b as set out hereinabove.

In general, the application of a temperature of about 100° C. in excess of the melting point of the fuel, preferably at least 150° C. in excess of the melting point of the fuel, more preferably at least 200° C. in excess of the melting point of the fuel can be considered to provide a substantial reduction of the spitting effect. With respect to the avoidance or mitigation of the spitting effect as described, it is further worth mentioning that the generation of bubbles in a liquid fuel layer may also be mitigated by ensuring that the surface that is covered by the liquid fuel layer is sufficiently smooth. As such, in an embodiment of the present invention, the debris-receiving surfaces as applied have received a polishing or micro polishing treatment.

Yet another way of mitigating the spitting effect is to provide a carbon layer on top of the liquid fuel layer. The application of such a carbon layer has been found to prevent, to a large extend, the spitting effect.

Figure 7:
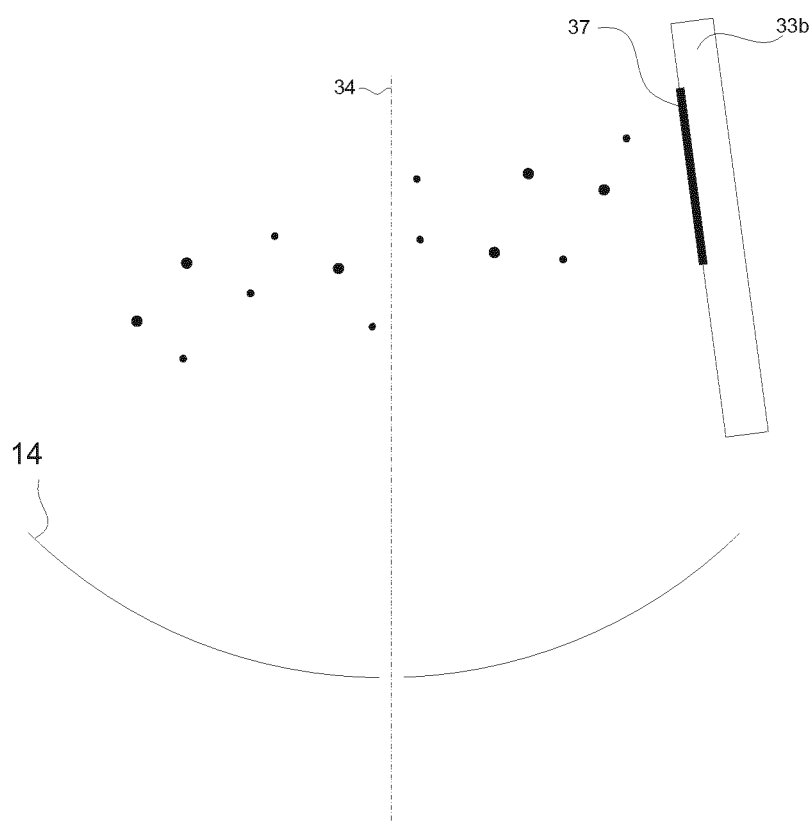
FIG. 7 schematically depicts the part of the radiation source of FIG. 6 according to an alternative embodiment.

FIG. 7 illustrates an alternative embodiment of the invention which is a modification of the arrangement of FIG. 6. In FIG. 7, it can be seen that the vane 33b has positioned such that normal lines from the surface of the vane 33b coated in the layer 37 no longer intersect the collector 14. As such, secondary debris ejected from the layer 37 is not incident upon the collector 14, thereby preventing contamination of the collector 14. In other embodiments of the present invention, the arrangements of FIGS. 5 and 7 may be combined to provide a radiation source in which the surfaces of the shroud 32 and the surfaces of the vanes 33 are arranged to reduce the effect of secondary debris on the collector 14. Further, while only the shroud 32, vanes 33a, 33b of the contaminant trap, and collector 14 are shown in FIGS. 4 to 6, in other embodiments of the invention, the orientation and position of other surfaces which are subject to primary contamination may be configured so as to reduce or eliminate the intersection of normal lines from those surfaces with other sensitive components of the radiation source SO or such surfaces may be heated to a sufficient temperature in order to provide substantial reduction in, or elimination of, the fuel spitting phenomenon.

In this way, by use of elevated temperatures for debris-receiving surfaces, in accordance with the invention, the effect of secondary debris can be minimized, leading to improved performance, reduced maintenance requirements and a longer useful lifetime of the radiation source SO. Additionally, the orientation and position of some surfaces which are subject to secondary (and tertiary) contamination may be selected so as to reduce or eliminate intersection of normal lines from those surfaces with any optically active surfaces of components of the radiation source SO.

While the above description with reference to FIGS. 3 to 7 has been particularly described with respect to a liquid fuel source of tin in the presence of hydrogen gas, it is to be understood that the problems and invention discussed above are equally applicable to other liquid fuel sources. For example, the composition of the fuel may be selected for lower temperature operation, in which case the fuel may be, for example, a eutectic alloy such as an alloy of tin and gallium, or an alloy of tin and indium. Furthermore, the invention is also applicable for use in the protection of optically-active surfaces within other portions of a lithography apparatus in addition to within the radiation source itself, for instance within the illuminator.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

Although specific reference may be made in this text to embodiments of the invention in the context of a lithographic apparatus, embodiments of the invention may be used in other apparatus. Embodiments of the invention may form part of processing tool such as a lithographic apparatus, a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses and claims that follow.

Clauses

1. A radiation source to provide radiation to a lithographic apparatus, the radiation source being configured to generate radiation from a plasma generated from a fuel within an enclosure comprising a gas, and the generated plasma resulting in emission of primary debris, the radiation source comprising:
    a component having an optically-active surface, and
    a debris-receiving surface having a fuel layer and configured to receive primary debris,
    wherein the debris-receiving surface is maintained at a temperature sufficiently high to maintain the fuel layer as a liquid and to provide a rate of formation of bubbles of the gas within said liquid fuel layer in use which is substantially lower than the rate of formation of bubbles of the gas within said liquid fuel layer at a temperature 20° C. in excess of the melting point of the fuel.
2. The radiation source of clause 1 wherein the debris-receiving surface comprises a heater.
3. The radiation source of clause 2, wherein the heater is an electrical heater or a heating pipe heated by a heat transfer fluid.
4. The radiation source of clause 1, wherein the debris-receiving surface is arranged to be maintained at a temperature in excess of 300° C. in use.
5. The radiation source of clause 1, wherein the debris-receiving surface is arranged to be maintained at a temperature sufficiently high to prevent formation of bubbles of said gas within said liquid fuel layer in use.
6. The radiation source of clause 1, wherein the debris-receiving surface is arranged to be maintained at a temperature of 550° C. or more in use
7. The radiation source of clause 1, wherein the radiation source is configured to receive an excitation beam such that, in use, the excitation beam is incident on the fuel at a plasma formation location to generate said plasma, and
    wherein the debris-receiving surface and component comprising an optically-active surface are mutually arranged such that substantially all lines normal to the debris-receiving surface do not intersect the optically-active surface of the component.
8. The radiation source of clause 1,
    wherein the radiation source comprises a shroud for shielding the fuel that travels to the plasma formation location; and
    wherein the debris-receiving surface comprises at least a part of a surface of the shroud.
9. The radiation source of clause 1, wherein the component comprises, as an optically-active component, a radiation collector arranged to collect radiation emitted by said plasma at the plasma formation location and to form a beam of radiation therefrom.
10. The radiation source of clause 1, wherein the radiation source comprises a contaminant trap arranged to reduce propagation of debris generated by said plasma; and
    wherein the debris-receiving surface comprises at least a part of a surface of the contaminant trap.
11. The radiation source of clause 1, further comprising a second debris-receiving surface, configured to receive the emission of primary debris and wherein:
    the second debris-receiving surface is arranged to be maintained at a temperature sufficiently high to maintain its respective fuel layer as liquid, and
    the second debris-receiving surface and component comprising an optically-active surface are mutually positioned and/or oriented such that substantially all lines normal to the second debris-receiving surface do not intersect the optically-active surface of the component.
12. A radiation source suitable for providing radiation to a lithographic apparatus, the radiation source being arranged to receive an excitation beam such that, in use, the excitation beam is incident on a fuel at a plasma formation location resulting in emission of primary debris, the radiation source comprising:
    a debris receiving surface configured to receive the emission of primary debris; and
    a component having an optically active surface;
    wherein the debris receiving surface and component are arranged such that substantially all lines normal to the debris receiving surface do not intersect the optically active surface of the component.
13. The radiation source of clause 12, wherein the radiation source comprises a shroud for shielding the fuel while the fuel travels to the plasma formation location; and
    wherein the debris receiving surface comprises at least a part of a surface of the shroud.
14. The radiation source of clause 12, wherein the component comprises a radiation collector arranged to collect radiation emitted by a plasma at the plasma formation location and form a beam of radiation therefrom.
15. The radiation source of clause 12, wherein the component comprises a sensor.
16. The radiation source of clause 12, wherein the component comprises a viewport and the optically active surface of the component comprises a window of the viewport.
17. The radiation source of clause 12, wherein the radiation source comprises a contaminant trap arranged to reduce propagation of debris generated by a plasma; and
    wherein the debris receiving surface comprises at least a part of a surface of the contaminant trap.
18. The radiation source of clause 17, wherein the contaminant trap comprises a plurality of vanes and the debris receiving surface comprises at least part of one of the plurality of vanes.
19. The radiation source of clause 12, wherein the radiation source further comprises a gas barrier.
20. The radiation source of clause 19, wherein the gas barrier comprises a hydrogen gas barrier.
21. The radiation source of clause 12, further comprising:
    a nozzle configured to direct a stream of fuel droplets along a trajectory towards a plasma formation location,
    wherein the debris receiving surface comprises at least a part of a surface of the nozzle.
22. A method of generating radiation for a lithography apparatus, the method comprising:
    providing an excitation beam to a plasma formation location within a radiation source of any of clauses 1 to 21; and
    providing a fuel at the plasma formation location;
    wherein the excitation beam excites the fuel such that the fuel forms a radiation emitting plasma.
23. A method according to clause 22, wherein providing a fuel at the plasma formation location comprises directing the fuel along a shroud.
24. A method according to clause 22, wherein radiation generated from the radiation emitting plasma is collected by a radiation collector arranged to direct the radiation to an intermediate focus.
25. A method according to clause 22, wherein the radiation generated from the radiation emitting plasma is EUV radiation.
26. A method of generating radiation for a lithography apparatus, the method comprising generating a plasma from a fuel in an enclosure of a radiation source according to clause 1, the enclosure comprising a gas, wherein the radiation is emitted from the plasma,
    wherein, in use, the debris-receiving surface is maintained at a temperature sufficiently high to maintain the fuel layer as a liquid and to provide a rate of formation of bubbles of the gas within the liquid fuel layer in use which is substantially lower than the rate of formation of bubbles of the gas within the liquid fuel layer at a temperature 20° C. in excess of the melting point of the fuel.

27. A method according to clause 26, wherein the fuel is tin.
28. A method according to clause 26, wherein the gas comprises or consists essentially of hydrogen.
29. A method according to clause 26, wherein the debris-receiving surface is maintained at a temperature of 300° C. or more in use.
30. A method according to clause 26, wherein the debris-receiving surface is maintained at a temperature sufficiently high to prevent formation of bubbles of the gas within the liquid fuel layer in use.
31. A method according to clause 26, wherein the debris-receiving surface is maintained at a temperature of 550° C. or more in use.
32. A method according to clause 26, wherein the radiation generated from the plasma comprises EUV radiation.
33. A lithographic apparatus arranged to project a conditioned radiation beam onto a substrate, wherein the lithographic apparatus comprises a radiation source according to clause 1.
34. The lithographic apparatus of clause 33, further comprising:
an illumination system configured to condition the radiation generated by the radiation source to form a conditioned radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.
35. The lithographic apparatus of clause 34, wherein the lithographic apparatus comprises a further debris-receiving surface positioned and/or oriented such that, in use, the emission of primary debris causes contamination of the debris-receiving surface with a fuel layer,
wherein the debris-receiving surface is arranged to be maintained at a temperature sufficiently high to maintain said fuel layer as a liquid and to provide a rate of formation of bubbles of said gas within said liquid fuel layer in use which is substantially lower than the rate of formation of bubbles of said gas within said liquid fuel layer at a temperature 20° C. in excess of the melting point of said fuel.
36. A device manufacturing method comprising generating radiation using the lithographic apparatus of clause 33.
37. The device manufacturing method according to clause 35, further comprising:
generating a beam of EUV radiation using the radiation source;
conditioning the radiation beam in the illumination system and directing the radiation beam onto a patterning device supported by the support structure; and
projecting, by means of the projection system, a patterned radiation beam onto a substrate held by the substrate table.

The invention claimed is:
1. A radiation source configured to generate radiation from a plasma generated from a fuel within an enclosure comprising a gas, and the generated plasma resulting in emission of primary debris, the radiation source comprising:
a component having an optically-active surface; and
a debris-receiving surface positioned and/or oriented such that, in use, the emission of primary debris causes contamination of the debris-receiving surface with a fuel layer,
wherein the debris-receiving surface is configured to be maintained at a temperature sufficiently high to maintain the fuel layer as a liquid and to provide a rate of formation of bubbles of the gas within the liquid fuel layer in use that is substantially lower than a rate of formation of bubbles of the gas within the liquid fuel layer at a temperature 20° C. in excess of a melting point of the fuel, so as to reduce an emission of secondary debris by spitting.
2. The radiation source according to claim 1, wherein the debris-receiving surface comprises a heater.
3. The radiation source according to claim 2, wherein the heater is an electrical heater or a heating pipe heated by a heat transfer fluid.
4. The radiation source according to claim 1, wherein the debris-receiving surface is configured to be maintained at the temperature in excess of 300° C. and less than 1000° C. in use.
5. The radiation source according to claim 1, wherein:
the radiation source is configured to receive an excitation beam such that, in use, the excitation beam is incident on the fuel at a plasma formation location to generate the plasma, and
the debris-receiving surface and the component comprising an optically-active surface are positioned and/or oriented such that substantially all lines normal to the debris-receiving surface do not intersect the optically-active surface of the component.
6. The radiation source according to claim 1, wherein the component comprises a radiation collector configured to collect radiation emitted by the plasma at a plasma formation location and to form a beam of radiation therefrom.
7. The radiation source according to claim 1, further comprising:
a contaminant trap configured to reduce propagation of the primary debris generated by the plasma,
wherein the debris-receiving surface comprises at least a part of a surface of the contaminant trap.
8. The radiation source according to claim 1, wherein the radiation source comprises a second debris-receiving surface, positioned and/or oriented such that, in use, the emission of primary debris causes contamination of the second debris-receiving surface with a second fuel layer, and wherein:
the second debris-receiving surface is configured to be maintained at a second temperature sufficiently high to maintain the second fuel layer as liquid, and
the second debris-receiving surface and the component comprising an optically-active surface are positioned and/or oriented such that substantially all lines normal to the second debris-receiving surface do not intersect the optically-active surface of the component.
9. The radiation source according to claim 1, wherein the debris-receiving surface is configured to be maintained at the temperature in excess of 350° C. and less than 550° C. in use.
10. The radiation source according to claim 1, wherein the debris-receiving surface is configured to be maintained at the temperature in excess of 550° C. and less than 1000° C. in use.
11. The radiation source according to claim 1, wherein the gas within the enclosure is at a pressure in a range of 50 Pa to 500 Pa.

12. A radiation source configured to generate radiation from a plasma generated from a fuel within an enclosure comprising a gas, and the generated plasma resulting in emission of primary debris, the radiation source comprising:
   a component having an optically-active surface; and
   a debris-receiving surface positioned and/or oriented such that, in use, the emission of primary debris causes contamination of the debris-receiving surface with a fuel layer,
   wherein the debris-receiving surface is configured to be maintained at a temperature to maintain the fuel layer as a liquid and which is at least 100° C. in excess of a melting point of the fuel so as to reduce a formation of bubbles of the gas within liquid fuel and to reduce an emission of secondary debris by spitting.

13. The radiation source according to claim 12, wherein the component comprises a radiation collector configured to collect radiation emitted by a plasma at the plasma formation location and form a beam of radiation therefrom.

14. The radiation source according to claim 12, wherein the debris-receiving surface is configured to be maintained at the temperature at least 150° C. in excess of the melting point of the fuel and less than 1000° C.

15. The radiation source according to claim 12, wherein the debris-receiving surface is configured to be maintained at the temperature at least 200° C. in excess of the melting point of the fuel and less than 1000° C.

16. A radiation source configured to receive an excitation beam such that, in use, the excitation beam is incident on a fuel at a plasma formation location resulting in emission of primary debris, the radiation source comprising:
   a shroud configured to shield the fuel from the primary debris while the fuel travels to the plasma formation location;
   a debris receiving surface comprising at least a part of a surface of the shroud and positioned and/or oriented such that, in use, the emission of primary debris causes contamination of the debris receiving surface; and
   a component having an optically active surface,
   wherein the debris receiving surface and the component are positioned and/or oriented such that substantially all lines normal to the debris receiving surface do not intersect the optically active surface of the component,
   wherein a surface of the shroud is maintained at a temperature above a melting point of the fuel.

17. The radiation source according to claim 16, wherein the component comprises a radiation collector configured to collect radiation emitted by a plasma at the plasma formation location and form a beam of radiation therefrom.

18. The radiation source according to claim 16, wherein the component comprises a sensor.

19. The radiation source according to claim 16, wherein the component comprises a viewport and the optically active surface of the component comprises a window of the viewport.

20. The radiation source according to claim 16, further comprising:
   a contaminant trap configured to reduce propagation of debris generated by a plasma; and
   a second debris receiving surface comprising at least a part of a surface of the contaminant trap.

21. The radiation source according to claim 20, wherein the contaminant trap comprises a plurality of vanes and the second debris receiving surface comprises at least part of one of the plurality of vanes.

22. The radiation source according to claim 21, wherein the radiation source further comprises a gas barrier.

23. The radiation source according to claim 16, further comprising:
   a nozzle configured to direct a stream of fuel droplets along a trajectory towards the plasma formation location; and
   a second debris receiving surface comprising at least a part of a surface of the nozzle.

24. A method of generating radiation comprising:
   providing an excitation beam to a plasma formation location within a radiation source comprising an enclosure comprising a gas;
   providing a fuel at the plasma formation location, wherein the excitation beam excites the fuel such that the fuel forms a radiation emitting plasma, the formation of the radiation emitting plasma causes emission of primary debris, and the emission of primary debris causes contamination of a debris-receiving surface of the radiation source with a fuel layer; and
   maintaining the debris-receiving surface at a temperature sufficiently high to maintain the fuel layer as a liquid and to provide a rate of formation of bubbles of gas within the liquid fuel layer that is substantially lower than a rate of formation of bubbles of the gas within the liquid fuel layer at a temperature 20° C. in excess of a melting point of the fuel, so as to reduce an emission of secondary debris by spitting.

25. A lithographic apparatus configured to project a conditioned radiation beam onto a substrate, the apparatus comprising:
   a radiation source configured to generate radiation from a plasma generated from a fuel within an enclosure comprising a gas, and the generated plasma resulting in emission of primary debris, the radiation source comprising:
      a component having an optically-active surface; and
      a debris-receiving surface positioned and/or oriented such that the emission of primary debris causes contamination of the debris-receiving surface with a fuel layer,
      wherein the debris-receiving surface is configured to be maintained at a temperature sufficiently high to maintain the fuel layer as a liquid and to provide a rate of formation of bubbles of the gas within the liquid fuel layer that is substantially lower than a rate of formation of bubbles of the gas within the liquid fuel layer at a temperature 20° C. in excess of a melting point of the fuel, so as to reduce an emission of secondary debris by spitting.

26. The lithographic apparatus according to claim 25, further comprising:
   an illumination system configured to condition the radiation generated by the radiation source to form the conditioned radiation beam;
   a support configured to support a patterning device, the patterning device configured to impart the conditioned radiation beam with a pattern in its cross-section to form a patterned radiation beam;
   a substrate table configured to hold the substrate; and
   a projection system configured to project the patterned radiation beam onto a target portion of the substrate.

* * * * *